United States Patent
Rusate

[19]

[11] Patent Number: 6,160,704
[45] Date of Patent: Dec. 12, 2000

[54] INTEGRAL HEAT-SINK AND MOTOR ASSEMBLY FOR PRINTED CIRCUIT BOARDS

[75] Inventor: James L. Rusate, Wallingford, Conn.

[73] Assignee: Intelligent Motion Systems, Malborough, Conn.

[21] Appl. No.: 09/213,797

[22] Filed: Dec. 17, 1998

[51] Int. Cl.[7] .................................................. H05K 7/20
[52] U.S. Cl. ..................... 361/697; 361/695; 361/704; 361/718; 361/717; 361/719; 257/718; 257/719; 257/722; 257/727; 165/80.2; 165/80.3; 174/16.1; 174/16.3
[58] Field of Search ..................................... 361/695, 697, 361/704, 717–719, 722, 723; 257/706, 717–719, 722; 165/80.2, 80.3; 174/16.1, 16.3

[56] References Cited

U.S. PATENT DOCUMENTS

| | | | |
|---|---|---|---|
| 4,587,595 | 5/1986 | Staples | 361/710 |
| 4,660,123 | 4/1987 | Hermann | 361/715 |
| 5,276,585 | 1/1994 | Smithers | 361/704 |
| 5,367,433 | 11/1994 | Blomquist | 361/704 |
| 5,495,392 | 2/1996 | Shen | 361/697 |
| 5,590,025 | 12/1996 | Clemens | 361/695 |
| 5,594,623 | 1/1997 | Schwegler | 361/697 |
| 5,615,998 | 4/1997 | Kodama et al. | 415/177 |
| 5,708,564 | 1/1998 | Lin | 361/704 |

FOREIGN PATENT DOCUMENTS

| | | |
|---|---|---|
| 11 087 962 | 8/1995 | Japan . |
| 7 231 059 | 8/1995 | Japan . |

*Primary Examiner*—Leo P. Picard
*Assistant Examiner*—Boris L. Chervinsky

[57] ABSTRACT

An integrated spring assembly having a first part for attachment to a miniature electric fan, a second part for attachment to a heat sink and a third part for attachment to a printed circuit board. A calibrated spring force is exerted by the first, second and third parts to insure efficient heat transfer from the printed circuit board to the heat sink.

8 Claims, 3 Drawing Sheets

INTEGRAL HEAT-SINK AND MOTOR ASSEMBLY FOR PRINTED CIRCUIT BOARDS

BACKGROUND OF THE INVENTION

Electronic components often require heat sinks and the like to remove heat therefrom to protect the components from thermal damage, especially when contained within an enclosure.

U.S. Pat. No. 5,237,485 entitled "Apparatus and Method for Improved Thermal Coupling of A Semiconductor Package to a Cooling Plate" describes the use of a spring clip to hold the heat sink in good thermal relation to printed circuit board.

Miniature electric fans are added to the heat sink to further increase the rate of heat transfer away from electronic components.

U.S. Pat. No. 5,690,468 entitled "Fan Assembly for an Integrated Circuit" describes one method for attaching a custom fan and heat sink device to an integrated circuit for efficient heat transfer.

When a miniature fan and heat sink are to be assembled to preexisting electronic components, it would be economically feasible to be able to attach the fan and heat sink assembly to the electronic components printed circuit boards without having to drill holes in either the heat sink or printed circuit board to make the connection therewith.

One purpose of the invention is to provide a spring clip arrangement whereby the miniature fan and heat sink assembly can be attached to electronic components in the field or factory without requiring screws, rivets or the like to make the attachment.

SUMMARY OF THE INVENTION

An integrated spring assembly having a first part for attachment to a miniature electric fan, a second part for attachment to a heat sink and a third part for attachment to electronic components. The spring force exerted between the heat sink and electronic components insures efficient heat transfer from the electronic components to the heat sink. The ambient cooling air flows from the electric fan out through the heat sink interstices to cool the electronic components.

DESCRIPTION OF THE PREFERRED EMBODIMENT

Figure 1:
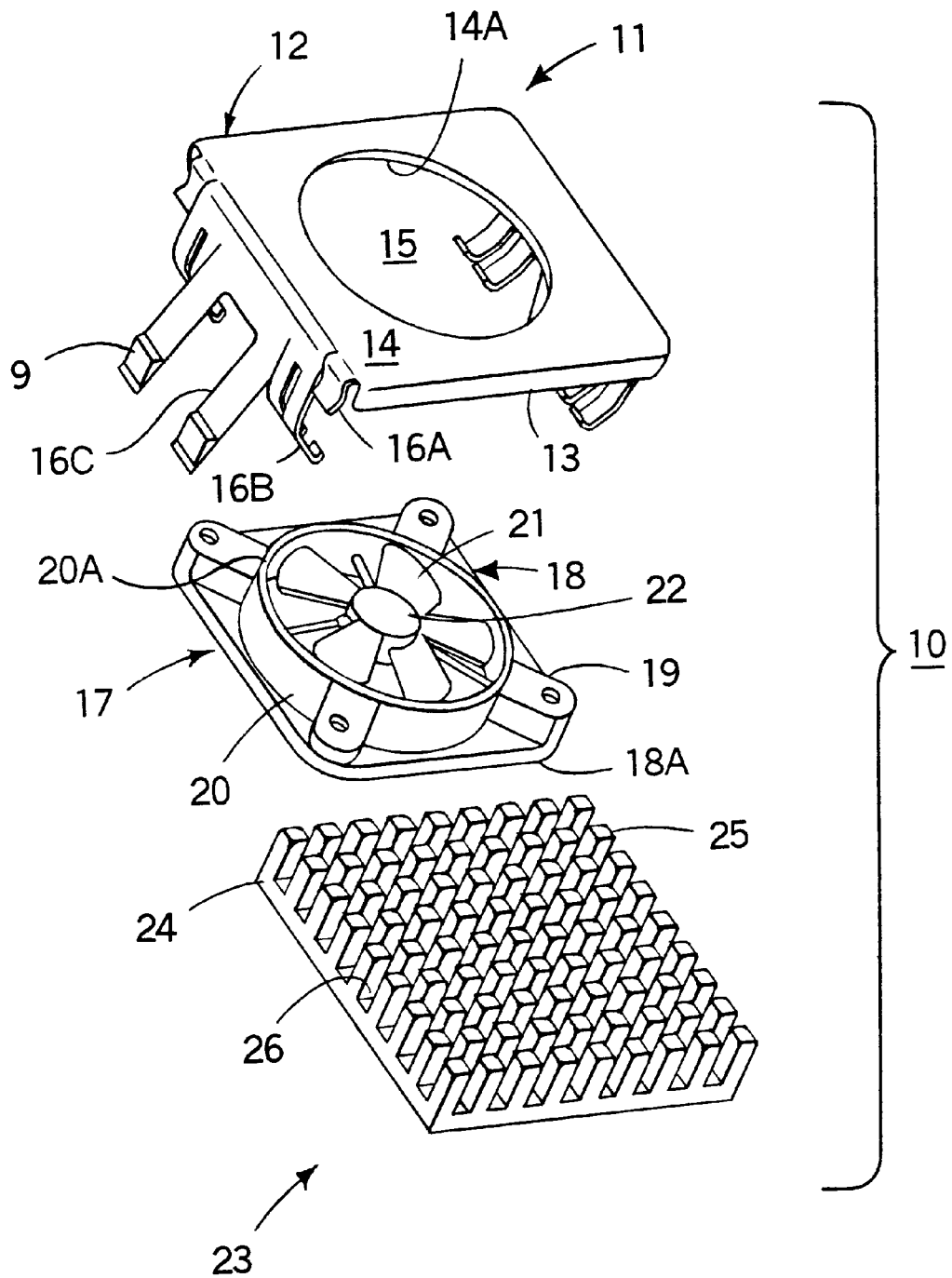
FIG. 1 is a top perspective view of the spring clip in isometric projection with the miniature fan and heat sink.
Figure 2:
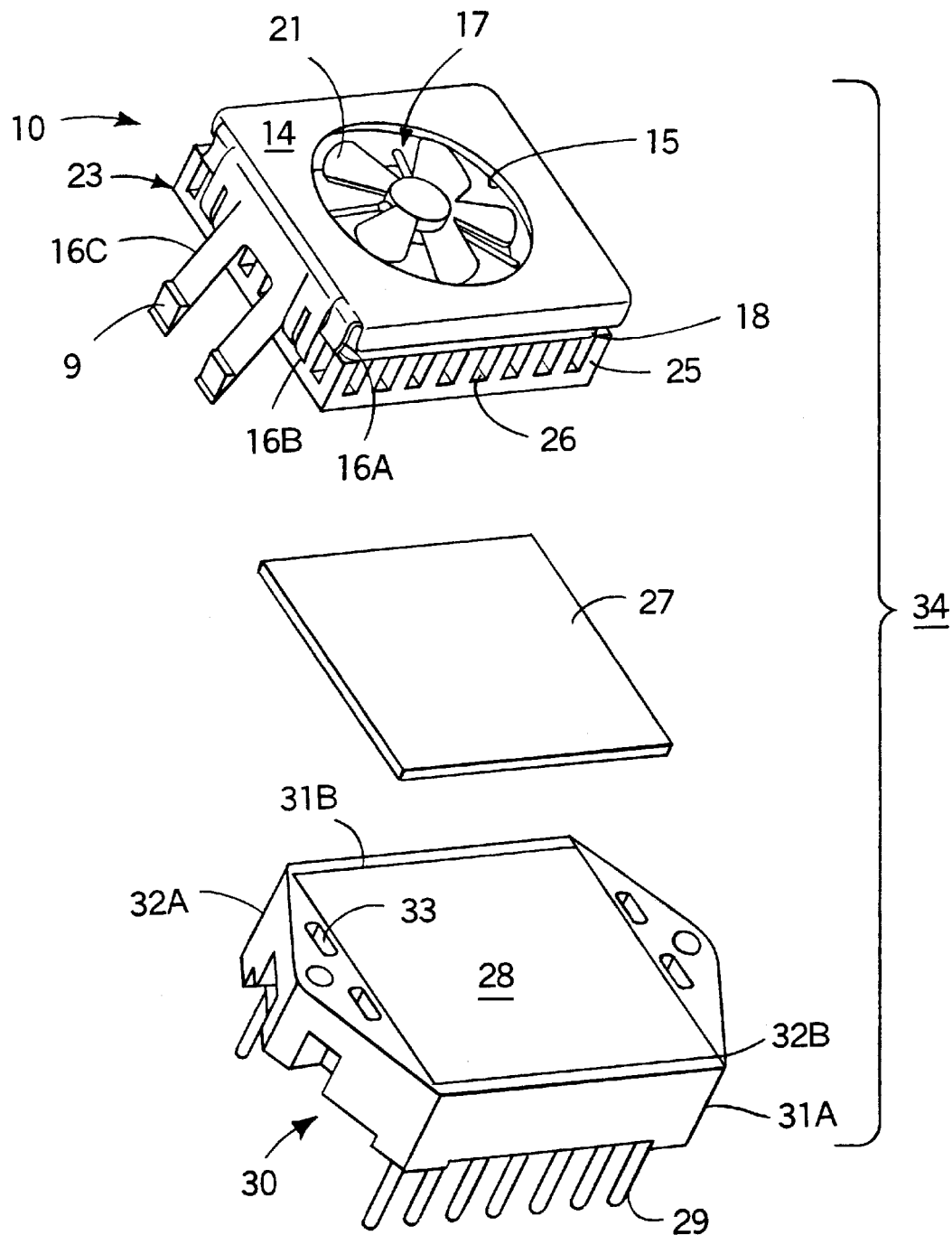
FIG. 2 is a top perspective view of the miniature electric fan attached to the heat sink prior to attachment to the electronic component.

The modular spring clip 11, shown in FIG. 1, provides the basis for the connection between the primary component in the form of the miniature cooling fan 17, the secondary component in the form of the finned heat sink 23 which comprise the heat transfer assembly 10 according to the invention. The spring clip 11 is in the form of a plate 12 of thin spring steel having a planar top 14 through which a circular aperture 15 is cut defining perimeter 14A. The sides of the plate are pressed downwards to define a perimetric rim as indicated at 13 which corresponds dimensionally with the edges 18A of the support member 18 carrying the fan 17. Downwardly depending primary connectors in the form of shaped primary clips 16A integrally-formed with the plate 12 engage the edges 18A of the support member 18 in press-fit relation whereby the top perimeter 20A of the raised cylinder 20 abuts the bottom of the perimeter 14A to position the fan blades 21 that extend from the rotor 22 under the circular aperture 15. The raised cross arms 19 extending from the fan support 18 provide added structural support to the fan 17 during extended operation. When the fan 17 is captured within the primary clips 16A, downwardly depending secondary connectors in the form of shaped secondary clips 16B integrally-formed with the plate 12 are captured within the interstices 26 formed within the radiator pins 25 extending upwards from the base 24 of the heat sink 23. One such heat sink is 698 series obtained from Wakefield Engineering. The longer downwardly depending tertiary connectors in the form of shaped tertiary clips 16C include tabs 9 formed in the ends thereof for connecting the heat transfer assembly 10 with the carrier module 30 that includes the electronic device 28, as best seen by now referring to FIG. 2.

With the fan 17 in thermal relation to the heat sink 23 by means of the spring clip 11 within the heat transfer assembly 10 by the arrangement of the primary and secondary clips 16A, 16B with the support member 18 and the interstices 26 formed within the radiator pins 25, respectively the fan blades 21 are positioned under the circular aperture 15 in the planar top 14, as described earlier to form the electronic package 34. To attach the heat transfer assembly 10 to the carrier module 30, a plate 27 of thermal transfer material, such as described within U.S. Pat. No. 3,631,325 entitled "Card Module and End Wall Treatment Facilitating Heat Transfer and Sliding" is positioned intermediate the carrier module 30 and the heat transfer assembly 10. The carrier module 30, which carries the electronic device 28, is in the form of opposing sides 31A, 31B and opposing ends 32A, 32B of a thermoset plastic material having slots 33 formed thereon for receiving the depending tertiary clips 16C and tabs 9, described earlier. The electronic device 28, including depending electrical pin connectors 29, can comprise application specific integrated circuits, hereinafter "ASIC" or microprocessors, multi-chip modules or hybrids thereof that are sensitive to temperature build-up. Although the electronic device 28 is shown within a carrier module, in some instances, the tertiary clips 16C can be adapted for attachment directly to the electronic device, per se, or to the circuit board (not shown) to which the electronic device is attached.

Figure 3:
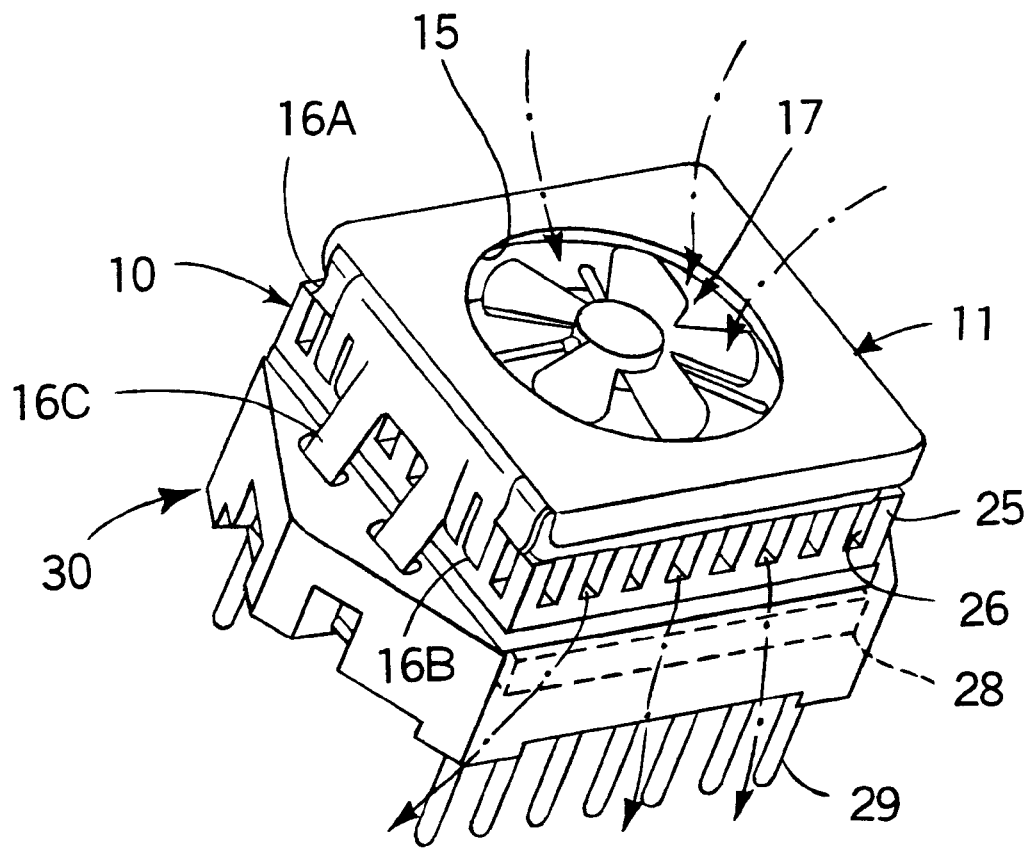
FIG. 3 is a top perspective view of the electric fan and heat sink of FIG. 2 attached to the electronic component.

The complete electronic package 34 is shown in FIG. 3 with the spring clip 11 tightly holding the heat transfer assembly 10 to the carrier module 30 by means of the primary, secondary and tertiary clips 16A, 16B, 16C. This allows connection between the carrier module 30 and allows the electronic device 28 to be connected within and electronic circuit via the electrical pin connectors 29 while the fan 17 operates to receive ambient air through the aperture 15 and exhaust the air out via the interstices 26 formed between the radiation pins 25, as indicated in phantom.

A convenient and inexpensive arrangement has herein been described whereby a heat transfer assembly can be either factory or field installed to a module carrying an electronic device or to the electronic device per se.

What is claimed is:

1. A heat exchanger clip for electronic devices comprising:

a planar metal plate having a central aperture air passage defined therein;

a first pair of primary clips extending downwards from said metal plate one on each side thereof and adapted for attachment to a cooling motor;

a first pair of secondary clips extending downwards from said metal plate one on each side thereof adjacent said primary clips, said secondary clips extending further from said metal plate than said primary clips and being adapted for attachment to a heat sink plate; and a first pair of tertiary clips extending downwards from said metal plate one on each side thereof; adjacent said secondary clips said tertiary clips extending further from said metal plate than said secondary clips and being adapted for attachment to and providing physical force to an electronic component.

2. The heat exchanger clip of claim 1 including a second pair of said primary clips on opposite sides of said metal plate.

3. The heat exchanger clip of claim 1 including a second pair of said secondary clips on opposite sides of said metal plate.

4. The heat exchanger clip of claim 1 including a second pair of said tertiary clips on opposite sides of said metal plate.

5. A heat exchanger assembly cooling an electronic component comprising:

a planar metal plate having a central aperture air passage defined therein;

a first pair of primary clips extending downwards from said metal plate one on each side thereof; a first pair of secondary clips extending downwards from said metal plate, one on each side thereof adjacent said primary clips, said secondary clips extending further from said metal plate than said primary clips;

a cooling motor including a plurality of fan blades arranged for transferring cooling air through said aperture, said cooling motor being captured between said primary clips;

a heat sink plate comprising a base member having a plurality of radiation pins extending therefrom, said heat sink plate being captured between said secondary clips; and a first pair of tertiary clips extending downwards from said metal plate one on each side thereof; adjacent said secondary clips said tertiary clips extending further from said metal plate than said secondary clips and being attached to an electronic component, whereby said cooling air transfers heat away from said electronic component.

6. The heat exchanger assembly of claim 5 wherein said electronic component is selected from the group comprising ASIC's, microprocessors, multi-chip boards and hybrids thereof.

7. The heat exchanger assembly of claim 6 including a second pair of said primary clips on opposite sides of said metal plate.

8. The heat exchanger assembly of claim 6 including a second pair of said secondary clips on opposite sides of said metal plate.

* * * * *